United States Patent
Schroeder et al.

(10) Patent No.: US 6,936,543 B2
(45) Date of Patent: Aug. 30, 2005

(54) CMP METHOD UTILIZING AMPHIPHILIC NONIONIC SURFACTANTS

(75) Inventors: David J. Schroeder, Aurora, IL (US); Kevin J. Moeggenborg, Naperville, IL (US); Homer Chou, Hoffman Estates, IL (US); Jeffrey P. Chamberlain, Aurora, IL (US); Joseph D. Hawkins, Aurora, IL (US); Phillip Carter, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 153 days.

(21) Appl. No.: 10/269,864

(22) Filed: Oct. 11, 2002

(65) Prior Publication Data

US 2003/0228763 A1 Dec. 11, 2003

Related U.S. Application Data

(63) Continuation-in-part of application No. 10/165,100, filed on Jun. 7, 2002.

(51) Int. Cl.⁷ ................ H01L 21/302; C09K 13/00
(52) U.S. Cl. ............ 438/692; 252/79.1; 252/79.4
(58) Field of Search .............. 438/692; 252/79.1, 252/79.4

(56) References Cited

U.S. PATENT DOCUMENTS

| | | | |
|---|---|---|---|
| 4,752,628 A | 6/1988 | Payne | |
| 4,867,757 A | 9/1989 | Payne | |
| 5,123,958 A | 6/1992 | Wiand | |
| 5,352,277 A | 10/1994 | Sasaki | |
| 5,527,423 A | 6/1996 | Neville et al. | |
| 5,849,233 A | 12/1998 | Altieri et al. | |
| 5,860,848 A | 1/1999 | Loncki et al. | |
| 5,876,490 A | 3/1999 | Ronay | |

(Continued)

FOREIGN PATENT DOCUMENTS

| EP | 1020488 A | 7/2000 |
| EP | 1 036 836 A1 * | 9/2000 |
| EP | 1 088 869 A1 * | 4/2001 |

(Continued)

OTHER PUBLICATIONS

Mcclatchie et al., *1998 Proceedings Fourth International Dielectrics for ULSI Multilevel Interconnection Conference (DUMIC)*, 311–318 (1998).
U.S. Appl. No. 10/165,100, filed Jun. 7, 2002, pending.

*Primary Examiner*—Nadine G. Norton
*Assistant Examiner*—Lynette T. Umez-Eronini
(74) *Attorney, Agent, or Firm*—Francis Koszyk

(57) ABSTRACT

The invention provides methods of polishing a substrate comprising (i) contacting a substrate comprising at least one metal layer comprising copper with a chemical-mechanical polishing (CMP) system and (ii) abrading at least a portion of the metal layer comprising copper to polish the substrate. The CMP system comprises (a) an abrasive, (b) an amphiphilic nonionic surfactant, (c) a means for oxidizing the metal layer, (d) an organic acid, (e) a corrosion inhibitor, and (f) a liquid carrier. The invention further provides a two-step method of polishing a substrate comprising a first metal layer and a second, different metal layer. The first metal layer is polishing with a first CMP system comprising an abrasive and a liquid carrier, and the second metal layer is polished with a second CMP system comprising (a) an abrasive, (b) an amphiphilic nonionic surfactant, and (c) a liquid carrier.

30 Claims, 3 Drawing Sheets

U.S. PATENT DOCUMENTS

| | | | |
|---|---|---|---|
| 5,958,794 A | 9/1999 | Bruxvoort et al. | |
| 6,043,155 A | 3/2000 | Homma et al. | |
| 6,046,112 A | 4/2000 | Wang | |
| 6,062,968 A | 5/2000 | Sevilla et al. | |
| 6,063,306 A | 5/2000 | Kaufman et al. | |
| 6,099,604 A | 8/2000 | Sandhu et al. | |
| 6,117,000 A | 9/2000 | Anjur et al. | |
| 6,117,220 A | 9/2000 | Kodama et al. | |
| 6,117,775 A | 9/2000 | Kondo et al. | |
| 6,117,783 A | 9/2000 | Small et al. | |
| 6,126,532 A | 10/2000 | Sevilla et al. | |
| 6,132,637 A | 10/2000 | Hosali et al. | |
| 6,153,525 A | 11/2000 | Hendricks et al. | |
| 6,171,352 B1 | 1/2001 | Lee et al. | |
| 6,270,393 B1 | 8/2001 | Kubota et al. | |
| 6,270,395 B1 | 8/2001 | Towery et al. | |
| 6,303,049 B1 | 10/2001 | Lee et al. | |
| 6,313,039 B1 | 11/2001 | Small et al. | |
| 6,348,076 B1 | 2/2002 | Canaperi et al. | |
| 6,375,545 B1 | 4/2002 | Yano et al. | |
| 6,375,693 B1 | 4/2002 | Cote et al. | |
| 6,376,381 B1 | 4/2002 | Sabde | 438/693 |
| 6,383,240 B1 * | 5/2002 | Nishimoto et al. | 51/307 |
| 6,420,269 B2 | 7/2002 | Matsuzawa et al. | 438/693 |
| 6,426,295 B1 | 7/2002 | Kramer et al. | |
| 2001/0005009 A1 | 6/2001 | Tsuchiya et al. | |
| 2001/0008828 A1 | 7/2001 | Uchikura et al. | |
| 2001/0013507 A1 | 8/2001 | Hosali et al. | |
| 2001/0054708 A1 | 12/2001 | Levert et al. | 252/79.1 |
| 2002/0023389 A1 | 2/2002 | Minamihaba et al. | |
| 2002/0037642 A1 | 3/2002 | Wake et al. | |
| 2002/0095872 A1 | 7/2002 | Tsuchiya et al. | 51/307 |
| 2002/0102923 A1 | 8/2002 | Sugiyama et al. | 451/41 |

FOREIGN PATENT DOCUMENTS

| | | | |
|---|---|---|---|
| EP | 1 104 778 A2 * | 6/2001 | |
| EP | 1 118 647 A1 * | 7/2001 | |
| EP | 0 810 302 B1 * | 8/2001 | |
| EP | 1138733 A | 10/2001 | |
| EP | 1 148 538 A1 * | 10/2001 | |
| EP | 1 150 341 A1 * | 10/2001 | |
| JP | 64-87146 A * | 3/1989 | |
| JP | 2001-64631 A * | 3/2001 | |
| WO | WO 99/64527 A1 * | 12/1999 | |
| WO | WO 00/30154 A2 * | 5/2000 | |
| WO | WO 00/49647 A1 * | 8/2000 | |
| WO | WO 01/02134 A1 * | 1/2001 | |
| WO | WO 01/14496 A1 * | 3/2001 | |
| WO | WO 01/32794 A1 * | 5/2001 | |
| WO | WO 02/04573 A2 * | 1/2002 | |

\* cited by examiner

CMP METHOD UTILIZING AMPHIPHILIC NONIONIC SURFACTANTS

CROSS-REFERENCE TO RELATED PATENT APPLICATIONS

This application is a continuation-in-part of copending U.S. patent application Ser. No. 10/165,100, filed on Jun. 7, 2002.

FIELD OF THE INVENTION

This invention pertains to methods of chemically-mechanically polishing substrates, especially substrates with a metal layer comprising copper, by use of chemical-mechanical polishing compositions comprising amphiphilic nonionic surfactants.

BACKGROUND OF THE INVENTION

Compositions and methods for planarizing or polishing the surface of a substrate, especially for chemical-mechanical polishing (CMP), are well known in the art. Polishing compositions (also known as polishing slurries) typically contain an abrasive material in an aqueous solution and are applied to a surface by contacting the surface with a polishing pad saturated with the polishing composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium. The polishing slurry is typically used in conjunction with a polishing pad (e.g., polishing cloth or disk). Suitable polishing pads are described in U.S. Pat. Nos. 6,062,968, 6,117,000, and 6,126,532, which disclose the use of sintered polyurethane polishing pads having an open-celled porous network, and U.S. Pat. No. 5,489,233, which discloses the use of solid polishing pads having a surface texture or pattern. Alternatively, the abrasive material may be incorporated into the polishing pad. U.S. Pat. No. 5,958,794 discloses a fixed abrasive polishing pad.

Polishing compositions for silicon-based inter-metal dielectric layers have been particularly well developed in the semiconductor industry, and the chemical and mechanical nature of polishing and wear of the silicon-based dielectrics is reasonably well understood. One problem with the silicon-based dielectric materials, however, is that their dielectric constant is relatively high, being approximately 3.9 or higher, depending on factors such as residual moisture content. As a result, the capacitance between the conductive layers is also relatively high, which in turn limits the speed (frequency) at which a circuit can operate. Strategies being developed to reduce the capacitance include (1) incorporating metals with lower resistivity values (e.g., copper), and (2) providing electrical isolation with insulating materials having lower dielectric constants relative to silicon dioxide.

One way to fabricate planar copper circuit traces on a silicon dioxide substrate is referred to as the damascene process. In accordance with this process, the silicon dioxide dielectric surface is patterned by a conventional dry etch process to form holes and trenches for vertical and horizontal interconnects. The patterned surface is coated with an adhesion-promoting layer such as titanium or tantalum and/or a diffusion barrier layer such as titanium nitride or tantalum nitride. The adhesion-promoting layer and/or the diffusion barrier layer are then over-coated with a copper layer. Chemical-mechanical polishing is employed to reduce the thickness of the copper over-layer, as well as the thickness of any adhesion-promoting layer and/or diffusion barrier layer, until a planar surface that exposes elevated portions of the silicon dioxide surface is obtained. The vias and trenches remain filled with electrically conductive copper forming the circuit interconnects.

Previously, it was believed that the removal rate of the copper and the adhesion-promoting layer and/or the diffusion barrier layer must both greatly exceed the removal rate of silicon dioxide so that polishing effectively stops when elevated portions of the silicon dioxide are exposed. The ratio of the removal rate of copper to the removal rate of silicon dioxide base is called "selectivity." A minimum selectivity of about 50 was desired for such chemical-mechanical polishing. However, when high selectivity copper slurries are used, the copper layers are easily over-polished creating a depression or "dishing" effect in the copper vias and trenches. This feature distortion is unacceptable due to lithographic and other constraints in semiconductor manufacturing. Another feature distortion that is unsuitable for semiconductor manufacturing is called "erosion." Erosion is the topography difference between a field of silicon oxide and a dense array of copper vias or trenches. In chemical-mechanical polishing, the materials in the dense array are removed or eroded at a faster rate than the surrounding field of silicon oxide. This causes a topography difference between the field of silicon oxide and the dense copper array. The industry standard for erosion is typically less than 500 Angstroms (Å).

A number of systems for chemical-mechanical polishing of copper have been disclosed. Kumar et al. in an article entitled "Chemical-Mechanical Polishing of Copper in Glycerol Based Slurries" (Materials Research Society Symposium Proceedings, 1996) disclose a slurry that contains glycerol and abrasive alumina particles. An article by Gutmann et al. entitled "Chemical-Mechanical Polishing of Copper with Oxide and Polymer Interlevel Dielectrics" (Thin Solid Films, 1995) discloses slurries based on either ammonium hydroxide or nitric acid that may contain benzotriazole (BTA) as an inhibitor of copper dissolution. Luo et al. in an article entitled "Stabilization of Alumina Slurry for Chemical-Mechanical Polishing of Copper" (Langmuir, 1996) discloses alumina-ferric nitrate slurries that contain polymeric surfactants and BTA. Carpio et al. in an article entitled "Initial Study on Copper CMP Slurry Chemistries" (Thin Solid Films, 1995) disclose slurries that contain either alumina or silica particles, nitric acid or ammonium hydroxide, with hydrogen peroxide or potassium permanganate as an oxidizer. While present day chemical-mechanical polishing systems are capable of removing a copper over-layer from a silicon dioxide substrate, the systems do not entirely satisfy the rigorous demands of the semiconductor industry. These requirements can be summarized as follows. First, there is a need for high removal rates of copper to satisfy throughput demands. Secondly, there must be excellent topography uniformity across the substrate. Finally, the CMP method must minimize local dishing and erosion effects to satisfy ever increasing lithographic demands.

The use of surfactants in abrasive compositions for copper polishing has been disclosed. For example, U.S. Pat. No. 6,270,393 discloses an abrasive slurry comprising alumina, an inorganic salt, a water-soluble chelating agent, and a surfactant which purportedly acts as a dispersant for the abrasive. The '393 patent discloses that the surfactant can be a nonionic surfactant having a hydrophilic-lipophilic balance (HLB) value of 10 or greater. U.S. Pat. No. 6,348,076 discloses polishing compositions for metal layer CMP comprising surfactants, in particular anionic surfactants. U.S. Pat. No. 6,375,545 discloses a polishing composition comprising a polymer particle abrasive in combination with an inorganic abrasive, an oxidizer, and an organic acid. U.S. Pat. No. 6,375,693 discloses a polishing composition comprising an oxidizer, a corrosion inhibitor, and an anionic surfactant (e.g., a fatty acid sulfonate ester surfactant). U.S. Pat. No. 6,383,240 discloses an aqueous dispersion for CMP comprising abrasive particles and an amphipathic surfactant having an HLB value of 6 or lower. U.S. Published Patent Application 2001/0008828 A1 discloses an aqueous polishing composition for copper and barrier film polishing comprising an abrasive, an organic acid, a heterocyclic compound, an oxidizer, and optionally a surfactant. U.S. Published Patent Application 2002/0023389 discloses the use of a surfactant, which can be an anionic, cationic, or nonionic surfactant, to minimize erosion and scratching of a substrate surface layer. U.S. Published Patent Application 2002/0037642 discloses a polishing composition for use in copper polishing comprising an oxidizer, a carboxylic acid, and an abrasive containing mainly aggregated θ-alumina particles having an average particle size of about 50 to 500 nm. The abrasive particles can be dispersed using a surfactant dispersing agent selected from anionic, cationic, ampholytic, or nonionic surfactants. WO 01/32794 A1 discloses a CMP slurry, for polishing a substrate with a tantalum barrier layer, comprising an organic additive, which can be any of a variety of surfactants, that purportedly forms bonds with the surface of the silica or copper substrate and suppresses formation of silica precipitates and copper staining. WO 02/04573 A2 discloses a polishing composition comprising hydrogen peroxide that is stabilized in the presence of silica abrasive further comprising an organic acid, benzotriazole, and a surfactant. EP 1 150 341 A1 discloses a polishing composition comprising an abrasive having a particle size of less than 100 nm, an oxidizer, an organic acid, benzotriazole, and a surfactant.

Despite the disclosure of numerous CMP compositions and methods, a need remains for CMP compositions and methods for use in the polishing of substrates containing metal layers, especially copper-containing metal layers. The invention provides such a CMP method, particularly that provides good selectivity of substrate layer removal as well as decreased dishing and erosion. These and other advantages of the invention, as well as additional inventive features, will be apparent from the description of the invention provided herein.

BRIEF SUMMARY OF THE INVENTION

The invention provides a method of polishing a substrate comprising a metal layer comprising (i) contacting a substrate comprising at least one metal layer comprising copper with a chemical-mechanical polishing system comprising (a) an abrasive, (b) an amphiphilic nonionic surfactant having an HLB of greater than 6, (c) a means for oxidizing the metal layer comprising copper, (d) an organic acid, (e) a corrosion inhibitor, and (f) a liquid carrier, and (ii) abrading at least a portion of the metal layer comprising copper to polish the substrate. In one embodiment, the abrasive has a mean primary particle size of about 100 nm or greater. In a second embodiment, the abrasive is selected from the group consisting of silica, ceria, titania, zirconia, co-formed particles thereof, polymer particles, polymer-coated particles thereof, polymer-coated alumina, and combinations thereof.

The invention further provides a method of polishing a substrate comprising (i) contacting a substrate comprising at least a first metal layer and a second, different metal layer, with a first chemical-mechanical polishing system suitable for removal of the first metal layer and abrading at least a portion of the first metal layer to polish the substrate, wherein the first chemical-mechanical polishing system comprises an abrasive and a liquid carrier, and subsequently, (ii) contacting the substrate with a second chemical-mechanical polishing system suitable for removal of the second metal layer and abrading at least a portion of the second metal layer to polishing the substrate, wherein the second chemical-mechanical polishing system comprises (a) an abrasive, a polishing pad, or a combination thereof, (b) an amphiphilic nonionic surfactant comprising a head group and a tail group, and having an HLB value of greater than 6, and (c) a liquid carrier, and wherein the first and second chemical-mechanical polishing systems are different.

DETAILED DESCRIPTION OF THE INVENTION

Figure 1:
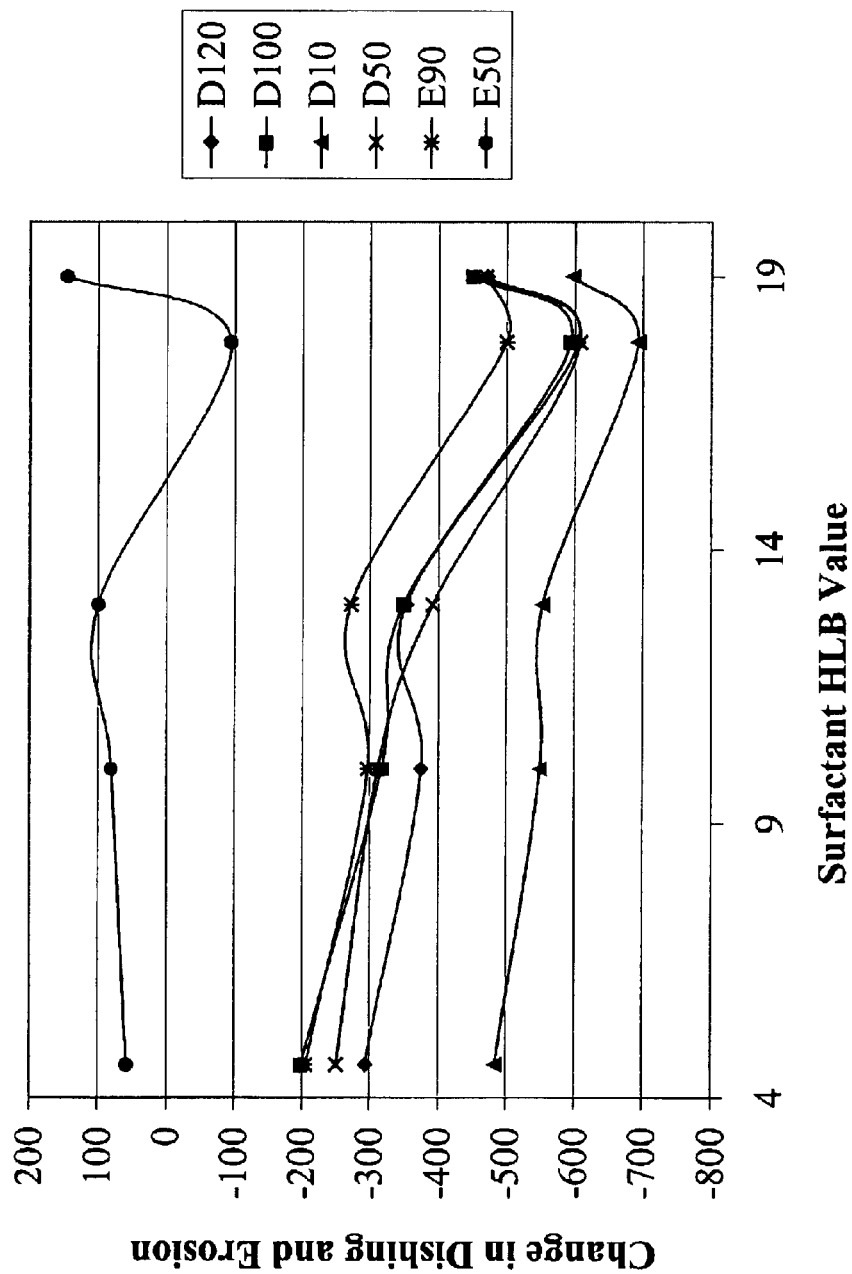
FIG. 1 is a plot showing the relationship between the HLB value of a surfactant in a CMP system and copper erosion resulting from use of the CMP system on a substrate comprising copper, at regions of 90% copper line density (E90) and 50% copper line density (E50), and copper dishing at 120 $\mu$m line (D120), 100 $\mu$m line (D100), 50 $\mu$m line (D50), and 10 $\mu$m line (D10) regions.

The invention is directed to methods of polishing a substrate comprising a metal layer (e.g., at least one metal layer). The methods involve (i) contacting the substrate with a chemical-mechanical polishing (CMP) system and (ii) abrading at least a portion of the substrate to polish the substrate. In the first and second embodiments, the metal layer of the substrate comprises copper. The CMP systems of the first and second embodiment comprise (a) an abrasive, (b) an amphiphilic nonionic surfactant, (c) a means for oxidizing the metal layer comprising copper, (d) an organic acid, (e) a corrosion inhibitor, and (f) a liquid carrier.

In the third embodiment, the substrate comprises a first metal layer and a second layer, and the method is a two-step method comprising contacting the first metal layer with a first CMP system and subsequently, contacting the second metal layer with a second CMP system. The first CMP system comprises at least an abrasive and a liquid carrier. The second CMP system comprises (a) an abrasive, (b) an amphiphilic nonionic surfactant, and (c) a liquid carrier. The first and second CMP systems optionally further comprise a means for oxidizing the metal layer, an organic acid, or a corrosion inhibitor. Preferably, the second CMP system comprises a means for oxidizing the metal layer. The first and second CMP systems can be either of the CMP systems described with respect to the first and second embodiments. The first CMP system and the second CMP system are different.

The CMP systems described herein comprise an abrasive and optionally a polishing pad. Preferably, the CMP systems comprise both an abrasive and a polishing pad. The abrasive can be in any suitable form (e.g., abrasive particles). The abrasive can be fixed on the polishing pad and/or can be in particulate form and suspended in the liquid carrier. The polishing pad can be any suitable polishing pad. The abrasive (when suspended in the liquid carrier), as well as any other components suspended in the liquid carrier, form the polishing compositions of the CMP systems.

In the first embodiment, the abrasive has a mean primary particle size of about 100 nm or greater (e.g., about 105 nm or greater, about 110 nm or greater, or even about 120 nm or greater). Typically, the abrasive has a mean primary particle size of about 500 nm or less (e.g., about 250 nm or less, or even about 200 nm or less). Preferably, the abrasive has a mean primary particle size of about 100 nm to about 250 nm (e.g., about 105 nm to about 180 nm). The abrasive can be substantially free of aggregated abrasive particles such that the mean particle size is about the same as the mean primary particle size. The abrasive can be any suitable abrasive, for example, an inorganic metal oxide abrasive selected from the group consisting of alumina (e.g., α-alumina, γ-alumina, δ-alumina, and fumed alumina), silica (e.g., colloidally dispersed condensation-polymerized silica, precipitated silica, fumed silica), ceria, titania, zirconia, germania, magnesia, co-formed products thereof, and combinations thereof. The metal oxide abrasive can be electrostatically coated with an oppositely-charged polyelectrolyte. The abrasive also can comprise a cross-linked polymer abrasive. Preferably, the abrasive is a silica abrasive or a polyelectrolyte-coated alumina abrasive (e.g., polystyrene-sulfonic acid-coated alumina abrasive).

In the second embodiment, the abrasive can have any suitable particle size and is selected from the group consisting of silica, ceria, titania, zirconia, co-formed particles thereof, polymer particles, polymer-coated particles thereof, polymer-coated alumina, and combinations thereof. Preferably, the abrasive is a silica abrasive or a polyelectrolyte-coated alumina abrasive (e.g., polystyrene-sulfonic acid-coated alumina abrasive). Silica abrasives and polymer-coated alumina abrasives are particularly desirably when polishing soft metal layers such as copper which can easily be scratched by hard abrasives such as alumina abrasives. The abrasive typically has a mean primary particle size of about 20 nm or greater (e.g., about 30 nm or greater, or even about 50 nm or greater). The mean primary particle size preferably is about 1 micron or less (e.g., about 500 nm or less). The abrasive in the second embodiment additionally can have the characteristics of the abrasive in the first embodiment, and vice versa.

In the third embodiment, the abrasive of the first and second CMP systems can be any suitable abrasive. Typically, the abrasive is selected from the group consisting of alumina, silica, ceria, titania, zirconia, co-formed particles thereof, polymer particles, polymer-coated particles thereof, and combinations thereof. The abrasive typically has a mean primary particle size of about 20 nm or greater (e.g., about 30 nm or greater, or even about 50 nm or greater). The mean primary particle size preferably is about 1 micron or less (e.g., about 500 nm or less). Preferably, the abrasive of the first CMP system is polymer-coated alumina (e.g., polystyrenesulfonic acid-coated alumina abrasive). Preferably, the abrasive of the second CMP system is silica having a mean primary particle size of about 80 nm or greater (e.g., about 100 nm or greater) and about 250 nm or less (e.g., about 200 nm or less).

The abrasive of any of the embodiments described herein can be colloidally stable. Colloid refers to the suspension of abrasive particles in the liquid carrier. Colloidal stability refers to the maintenance of that suspension through time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.8 (i.e., $\{[B]-[T]\}/[C] \leq 0.8$).

The polishing systems typically comprise about 0.1 wt. % to about 20 wt. % (e.g., about 0.5 wt. % to about 15 wt. %, or about 1 wt. % to about 10 wt. %) abrasive, based on the weight of the liquid carrier and any components dissolved or suspended therein.

The amphiphilic nonionic surfactant is a surfactant having a hydrophilic portion and a hydrophobic portion. For the purposes of this invention, the amphiphilic nonionic surfactant is defined as having a head group and a tail group. The head group is the hydrophobic portion of the surfactant, and the tail group is the hydrophilic portion of the surfactant. Any suitable head group and any suitable tail group can be used. The amphiphilic nonionic surfactant can comprise any suitable combination of head groups and tail groups. For example, the amphiphilic nonionic surfactant can comprise only one head group in combination with one tail group, or in some embodiments, can comprise multiple (e.g., 2 or more) head groups and/or multiple (e.g., 2 or more) tail groups. Preferably, the amphiphilic nonionic surfactant is water-soluble.

The head group can be any suitable group that is substantially hydrophobic. For example, suitable head groups include polysiloxanes, tetra-$C_{1-4}$-alkyldecynes, saturated or partially unsaturated $C_{6-30}$ alkyls, polyoxypropylenes, $C_{6-12}$ alkyl phenyls or cyclohexyls, polyethylenes, or mixtures thereof. The saturated or partially unsaturated $C_{6-30}$ alkyls optionally can be substituted with functional groups, for example short chain ($C_{1-5}$) alkyls, $C_{6-30}$ aryls, short chain ($C_{1-5}$) fluorocarbons, hydroxyls groups, halo groups, carboxylic acids, esters, amines, amides, glycols, and the like. Preferably, when the head group is a saturated or partially unsaturated $C_{6-30}$ alkyl, the degree of substitution with hydrophilic groups is very low (e.g., fewer than about 3, or fewer than about 2 hydrophilic groups). More preferably, the head group is not substituted with hydrophilic groups (e.g., hydroxyl groups and carboxylic acid groups).

The tail group can be any suitable group that is substantially hydrophilic. For example, suitable tail groups include those comprising a polyoxyethylene group, preferably having about 4 or more (e.g., about 8 or more, or even 10 or more) ethylene oxide repeating units, a sorbitan group, highly substituted saturated or partially unsaturated $C_{6-30}$ alkyls, a polyoxyethylenesorbitan group, or a mixture thereof. The highly substituted saturated or partially unsaturated $C_{6-30}$ alkyls preferably are substituted with hydrophilic functional groups, for example hydroxyl groups and carboxylic acid groups.

The amphiphilic nonionic surfactant can be an acetylenic glycol surfactant comprising a tetraalkyldecyne head group and an oxyethylene tail group, as in 2,4,7,9-tetramethyl-5-decyne-4,7-diol ethoxylate surfactants. The amphiphilic nonionic surfactant also can be selected from the group consisting of polyoxyethylene alkyl ethers and polyoxyethylene alkyl acid esters, wherein alkyl is a $C_{6-30}$ alkyl, which can be saturated or partially unsaturated, and is optionally branched. For example, the amphiphilic nonionic surfactant can be a polyoxyethylene lauryl ether, polyoxyethylene cetyl ether, polyoxyethylene stearyl ether, polyoxyethylene oleyl ether, polyoxyethylene monolaurate, polyoxyethylene monostearate, polyoxyethylene distearate, or polyoxyethylene monooleate. Similarly, the amphiphilic nonionic surfactant can be a polyoxyethylene alkylphenyl ether or a polyoxyethylene alkylcyclohexyl ether, wherein alkyl is a $C_{6-30}$ alkyl, can be saturated or partially unsaturated, and can be optionally branched, such as a polyoxyethylene octyl phenyl ether or a polyoxyethylene nonyl phenyl ether.

The amphiphilic nonionic surfactant can be a sorbitan alkyl acid ester or a polyoxyethylenesorbitan alkyl acid ester, wherein the alkyl is a $C_{6-30}$ alkyl, can be saturated or partially unsaturated, and can be optionally branched. Examples of such surfactants include sorbitan monolaurate, sorbitan monooleate, sorbitan monopalmitate, sorbitan monostearate, sorbitan sesquioleate, sorbitan trioleate, or sorbitan tristearate, as well as a polyoxyethylenesorbitan monolaurate, polyoxyethylenesorbitan monopalmitate, polyoxyethylenesorbitan monostearate, polyoxyethylenesorbitan tristearate, polyoxyethylenesorbitan monooleate, polyoxyethylenesorbitan trioleate, or polyoxyethylenesorbitan tetraoleate. When the amphiphilic nonionic surfactant is a sorbitan alkyl acid ester, sorbitan monolaurate and sorbitan monopalmitate are preferred.

The amphiphilic nonionic surfactant can be a block or graft copolymer comprising polydimethylsiloxane and polyoxyethylene, polyoxyethylene and polyoxypropylene, or polyoxyethylene and polyethylene. The amphiphilic nonionic surfactant also can be a polyoxyethylene alkyl amine (e.g., polyoxyethylene lauryl amine, polyoxyethylene stearyl amine, polyoxyethylene oleyl amine), an ethoxylated amide, an ethoxylated alkyl alkanolamide, an alkyl polyglucose, or an ethoxylate esters or diesters of alkyl glucoses (e.g., PEG-120 methyl glucose dioleate and the like).

Preferred amphiphilic nonionic surfactants include polyoxyethylenesorbitan alkyl acid esters (e.g., polyoxyethylenesorbitan monolaurate, polyoxyethylenesorbitan monopalmitate, polyoxyethylenesorbitan sesquioleate, and polyoxyethylenesorbitan trioleate), alkylphenyl polyoxyethylenes, and acetylenic diol based surfactants. In particular, polyoxyethylene nonyl phenyl ether surfactants, 2,4,7,9-tetramethyl-5-decyne-4,7-diol ethoxylate surfactants, polyoxyethylene alkyl amine surfactants, and polydimethylsiloxane/polyoxyethylene surfactants are preferred amphiphilic nonionic surfactants.

The polishing systems typically comprise about 0.1 wt. % or less amphiphilic nonionic surfactant, based on the weight of the liquid carrier and any compounds dissolved or suspended therein. Preferably, the polishing system comprises about 0.001 wt. % to about 0.06 wt. % (e.g., about 0.01 wt. % to about 0.04 wt. %) amphiphilic nonionic surfactant, based on the weight of the liquid carrier and any compounds dissolved or suspended therein.

The amphiphilic nonionic surfactant, or mixture of amphiphilic nonionic surfactants, typically has a hydrophilic-lipophilic balance (HLB) value of greater than 6 (e.g., about 7 or greater, about 10 or greater, about 12 or greater, or even about 14 or greater). The HLB value typically is about 20 or less (e.g., about 19 or less). For some embodiments, the HLB value preferably is greater than 6 and about 18 or less (e.g., about 7 to about 17, or about 8 to about 16). The HLB value indicates the solubility of a surfactant in water and, thus, is related to the wt. % amount of the hydrophilic portion of the surfactant (e.g., the wt. % amount of ethylene oxide). The surfactant HLB value can be approximated, in some cases, for nonionic surfactants containing an ethylene oxide group as being equal to the wt. % amount of the ethylene oxide groups divided by 5. When a combination of amphiphilic nonionic surfactants is used in the polishing system described herein, the HLB value for the system can be estimated, in some cases, as the weight average of the surfactants. For example, for a mixture of two amphiphilic nonionic surfactants, the HLB value is approximately equal to the sum of (quantity surfactant 1)(HLB surfactant 1) and (quantity surfactant 2)(HLB surfactant 2) divided by the sum of the quantity of surfactants 1 and 2. A low HLB value indicates a lipophilic surfactant (i.e., having a small number of hydrophilic groups), and a high HLB value indicates a hydrophilic surfactant (having a high number of hydrophilic groups).

The amphiphilic nonionic surfactant typically has a molecular weight of about 500 g/mol or more and about 10,000 g/mol or less. Preferably, the molecular weight is about 750 g/mol to about 5,000 g/mol (e.g., about 1,000 g/mol to about 3,000 g/mol).

The means for oxidizing the metal layer can be any suitable means for oxidizing the substrate, which includes any physical or chemical means. In electrochemical polishing systems, preferably the means for oxidizing the substrate comprises a device for applying a time-varying potential (e.g., anodic potential) to the substrate (e.g., electronic potentiostat). In CMP systems, preferably the means for oxidizing the substrate is a chemical oxidizing agent.

The device for applying time-varying potential to the substrate can be any suitable such device. The means for oxidizing the substrate preferably comprises a device for applying a first potential (e.g., a more oxidizing potential) during an initial stage of the polishing and applying a second potential (e.g., a less oxidizing potential) at or during a later stage of polishing, or a device for changing the first potential to the second potential during an intermediate stage of polishing, e.g., continuously reducing the potential during the intermediate stage or rapidly reducing the potential from a first, higher oxidizing potential to a second, lower oxidizing potential after a predetermined interval at the first, higher oxidizing potential. For example, during the initial stage(s) of the polishing, a relatively high oxidizing potential is applied to the substrate to promote a relatively high rate of oxidation/dissolution/removal of the substrate. When polishing is at a later stage, e.g., when approaching an underlying barrier layer, the applied potential is reduced to a level producing a substantially lower or negligible rate of oxidation/dissolution/removal of the substrate, thereby eliminating or substantially reducing dishing, corrosion, and erosion. The time-varying electrochemical potential is preferably applied using a controllably variable DC power supply, e.g., an electronic potentiostat. U.S. Pat. No. 6,379, 223 further describes a means for oxidizing a substrate by applying a potential.

The chemical oxidizing agent can be any suitable oxidizing agent. Suitable oxidizing agents include inorganic and organic per-compounds, bromates, nitrates, chlorates, chromates, iodates, iron and copper salts (e.g., nitrates, sulfates, ethylenediaminetetraacetic acid (EDTA), and citrates), rare earth and transition metal oxides (e.g., osmium tetraoxide), potassium ferricyanide, potassium dichromate, iodic acid, and the like. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, perchlorate salts, perboric acid, perborate salts, and permanganates. The oxidizing agent preferably is hydrogen peroxide. The polishing system, especially the CMP system (particularly the polishing composition), typically comprises about 0.1 wt. % to about 15 wt. % (e.g., about 0.2 wt. % to about 10 wt. %, about 0.5 wt. % to about 8 wt. %, or about 1 wt. % to about 5 wt. %) oxidizing agent, based on the weight of the liquid carrier and any compounds dissolved or suspended therein.

The organic acid can be any suitable organic acid. Typically, the organic acid is a carboxlic acid, for example, a mono-, di-, or tri-carboxylic acid. Suitable carboxylic acids include acetic acid, glycolic acid, lactic acid, citric acid, gluconic acid, gallic acid, oxalic acid, phthalic acid, succinic acid, tartaric acid, malic acid, propionic acid, combinations thereof, salts thereof, and the like. Preferably, the organic acid is selected from the group consisting of acetic acid, oxalic acid, tartaric acid, lactic acid, phthalic acid, propionic acid, salts thereof, and combinations thereof. The amount of organic acid used in the polishing system typically is about 0.01 to about 5 wt. %, preferably about 0.05 to about 3 wt. %.

The corrosion inhibitor (i.e., a film-forming agent) can be any suitable corrosion inhibitor. Typically, the corrosion inhibitor is an organic compound containing a heteroatom-containing functional group. For example, the corrosion inhibitor is a heterocyclic organic compound with at least one 5- or 6-member heterocyclic ring as the active functional group, wherein the heterocyclic ring contains at least one nitrogen atom, for example, an azole compound. Preferably, the corrosion inhibitor is a triazole; more preferably, 1,2,4-triazole, 1,2,3-triazole, or benzotriazole. The amount of corrosion inhibitor used in the polishing system typically is about 0.0001 to about 3 wt. %, preferably about 0.001 to about 2 wt. %.

A liquid carrier is used to facilitate the application of the abrasive (when present and suspended in the liquid carrier) and any components dissolved or suspended therein to the surface of a suitable substrate to be polished (e.g., planarized). The liquid carrier is typically an aqueous carrier and can be water alone, can comprise water and a suitable water-miscible solvent, or can be an emulsion. Suitable water-miscible solvents include alcohols such as methanol, ethanol, etc. Preferably, the aqueous carrier consists of water, more preferably deionized water.

The polishing compositions can have any suitable pH, for example, the polishing compositions can have a pH of about 2 to about 12. Typically, the polishing compositions have a pH of about 3 or greater (e.g., about 5 or greater, or about 7 or greater) and a pH of about 12 or lower (e.g., about 10 or lower).

The CMP systems optionally can further comprise other components. Such other components include complexing or chelating agents, biocides, anti-foaming agents, and the like.

The complexing or chelating agent is any suitable chemical additive that enhances the removal rate of the substrate layer being removed. Suitable chelating or complexing agents can include, for example, carbonyl compounds (e.g., acetylacetonates, and the like), di-, tri-, or polyalcohols (e.g., ethylene glycol, pyrocatechol, pyrogallol, tannic acid, and the like) and amine-containing compounds (e.g., ammonia, amino acids, amino alcohols, di-, tri-, and polyamines, and the like). The choice of chelating or complexing agent will depend on the type of substrate layer being removed in the course of polishing a substrate with the polishing composition. The amount of complexing agent used in the polishing system typically is about 0.1 to about 10 wt. %, preferably about 1 to about 5 wt. %

The biocide can be any suitable biocide, for example isothiazolinone biocide. The amount of biocide used in the polishing system typically is about 1 to about 50 ppm, preferably about 10 to about 20 ppm.

The anti-foaming agent can be any suitable anti-foaming agent. For example, the anti-foaming agent can be a polydimethylsiloxane polymer. The amount of anti-foaming agent present in the polishing system typically is about 40 to about 140 ppm.

It will be appreciated that many of the aforementioned compounds can exist in the form of a salt (e.g., a metal salt, an ammonium salt, or the like), an acid, or as a partial salt. For example, citrates include citric acid, as well as mono-, di-, and tri-salts thereof, phthalates include phthalic acid, as well as mono-salts (e.g., potassium hydrogen phthalate) and di-salts thereof; perchlorates include the corresponding acid (i.e., perchloric acid), as well as salts thereof. Furthermore, certain compounds or reagents may perform more than one function. For example, some compounds can function both as a chelating agent and an oxidizing agent (e.g., certain ferric nitrates and the like).

The CMP systems optionally can further comprise one or more components such as pH adjusters, regulators, or buffers, and the like. Suitable pH adjusters, regulators, or buffers can include, for example, sodium hydroxide, potassium hydroxide, ammonium hydroxide, sodium carbonate, potassium carbonate, sulfuric acid, hydrochloric acid, nitric acid, phosphoric acid, citric acid, potassium phosphate, mixtures thereof, and the like.

The CMP systems of the first and second embodiments are intended for use in polishing (e.g., planarizing) a substrate comprising at least one metal layer comprising copper. The substrate preferably is a microelectronic (e.g., semiconductor) substrate. The substrate optionally further comprises a second metal layer and/or a dielectric layer. Preferably, the substrate comprises both copper and tantalum. The dielectric layer can have any suitable dielectric constant. For example, the dielectric layer can comprise silicon dioxide or an organically modified silicon glass, such as carbon-doped silicon dioxide. The presence of the amphiphilic nonionic surfactant can reduce the dishing of the copper-containing metal layer. When the substrate comprises a copper-containing metal layer and a dielectric layer, the presence of the amphiphilic nonionic surfactant also can reduce the erosion of the dielectric layer. The CMP systems of the first and second embodiments can be used in a method of first step copper polishing, in which a large amount of copper desirably is removed (e.g., bulk copper removal), or a method of second step copper polishing, in which only a small amount of copper is removed (e.g., after removal of a barrier layer, such as tantalum).

The first and second CMP systems of the third embodiment are intended for use in polishing (e.g., planarizing) a substrate comprising a first metal layer and a second metal layer. The first metal layer and the second metal layer of the substrate can comprise any suitable metal, including a metal selected from the group consisting of copper, tantalum, titanium, aluminum, tungsten, platinum, iridium, nickel, ruthenium, rhodium, alloys thereof, and combinations thereof. The first metal layer and the second metal layer typically comprise different metals. Preferably, the first metal layer comprises copper or tungsten, more preferably, copper. Preferably, the second metal layer comprises tantalum or titanium, more preferably tantalum. The substrate typically is a microelectronic (e.g., semiconductor) substrate and optionally further comprises a dielectric layer. The dielectric layer can have any suitable dielectric constant (e.g., about 3.5 or more, or about 3.5 or less). For example, the dielectric layer can comprise silicon dioxide or an organically modified silicon glass, such as carbon-doped silicon dioxide. The microelectronic substrates typically are formed by etching trenches or vias into a dielectric layer such as an oxide film. The trenches or vias are then lined with a thin barrier film such as Ti, TiN, Ta, or TaN, for example by physical vapor deposition (PVD) (e.g., sputtering), or by chemical vapor deposition (CVD). A conductive metal layer (e.g., copper or tungsten) is then deposited over the barrier film so as to completely fill the trenches and vias and overlay the barrier film. A first CMP process, using the first CMP system, takes place so as to remove the conductive metal layer (i.e., the first metal layer) down to the barrier film. A second CMP process, using the second CMP system, then takes place to remove the barrier film (i.e., the second metal layer) and any excess conductive metal layer down to the dielectric oxide material. During the second CMP process, unacceptable dishing of the conductive metal layer in the vias or trenches can occur, as well as undesirable scratching or erosion of the dielectric material. The presence of the amphiphilic nonionic surfactant having an HLB of greater than 6 in the second CMP system can reduce the amount of dishing of the first metal layer (e.g., the conductive metal layer) during removal of the second metal layer (e.g., the barrier film), and/or can reduce the scratching and/or erosion of the dielectric layer (e.g., the oxide layer).

The CMP systems described herein are particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad intended to contact a substrate to be polished. The polishing of the substrate takes place by the substrate being placed in contact with the polishing pad and then the polishing pad moving relative to the substrate, typically with a polishing composition of the invention therebetween, so as to abrade at least a portion of the substrate to polish the substrate. The CMP apparatus can be any suitable CMP apparatus, many of which are known in the art.

The following examples further illustrate the invention but, of course, should not be construed as in any way limiting its scope.

EXAMPLE 1

This example illustrates the effect of amphiphilic nonionic surfactants in polishing compositions on copper dishing and erosion values as a function of surfactant HLB value.

Similar patterned substrates containing copper, tantalum, and silicon dioxide (Sematech 931 mask wafers) were polished with different polishing compositions (Polishing Compositions 1A–1E). Each of the polishing compositions contained 12 wt. % condensation-precipitated silica, 0.10 wt. % benzotriazole, 0.30 wt. % acetic acid, 3 wt. % hydrogen peroxide, and 200 ppm surfactant with a pH of about 10 (adjusted with KOH). Polishing Compositions 1A (comparative) and 1B–1E (invention) contained polyoxyethylene(2)isooctylphenyl ether having an HLB of 4.6, polyoxyethylene(5)isooctylphenyl ether having an HLB of 10, polyoxyethylene(9)nonylphenyl ether having an HLB of 13, polyoxyethylene(40)nonylphenyl ether having an HLB of 17.8, and polyoxyethylene(100)nonylphenyl ether having an HLB of 19, respectively. The changes in the values for copper dishing (in angstroms) were measured for four different regions of the substrate including the 120 $\mu$m line, 100 $\mu$m line, 50 $\mu$m line, and 10 $\mu$m line regions. The changes in the values for silicon dioxide erosion (in angstroms) were measured for two different regions of copper line density. The first region (E90) had 90% copper line density (4.5 $\mu$m Cu lines separated by 0.5 $\mu$m space), and the second region (E50) had 50% copper line density (2.5 $\mu$m Cu lines separated by 2.5 $\mu$m space). Negative changes in dishing or erosion value indicate an improvement (or correction) in the copper dishing or dielectric erosion over the dishing and erosion values obtained using similar polishing compositions containing no amphiphilic nonionic surfactant.

The results are summarized in Table 1 and in FIG. 1. A plot of the % copper dishing correction for the 50 $\mu$m line as a function of surfactant HLB is shown in FIG. 2.

TABLE 1

| Polishing Composition | HLB | Change in D120 (Å) | Change in D100 (Å) | Change in D10 (Å) | Change in D50 (Å) | Change in E90 (Å) | Change in E50 (Å) |
| --- | --- | --- | --- | --- | --- | --- | --- |
| 1A (comparative) | 4.6 | −294 | −199 | −484 | −251 | −206 | 57 |
| 1B (invention) | 10 | −375 | −318 | −550 | −312 | −297 | 80 |
| 1C (invention) | 13 | −353 | −349 | −554 | −392 | −272 | 99 |
| 1D (invention) | 17.8 | −605 | −594 | −693 | −608 | −500 | −94 |
| 1E (invention) | 19 | −472 | −450 | −597 | −462 | −470 | 145 |

Figure 2:
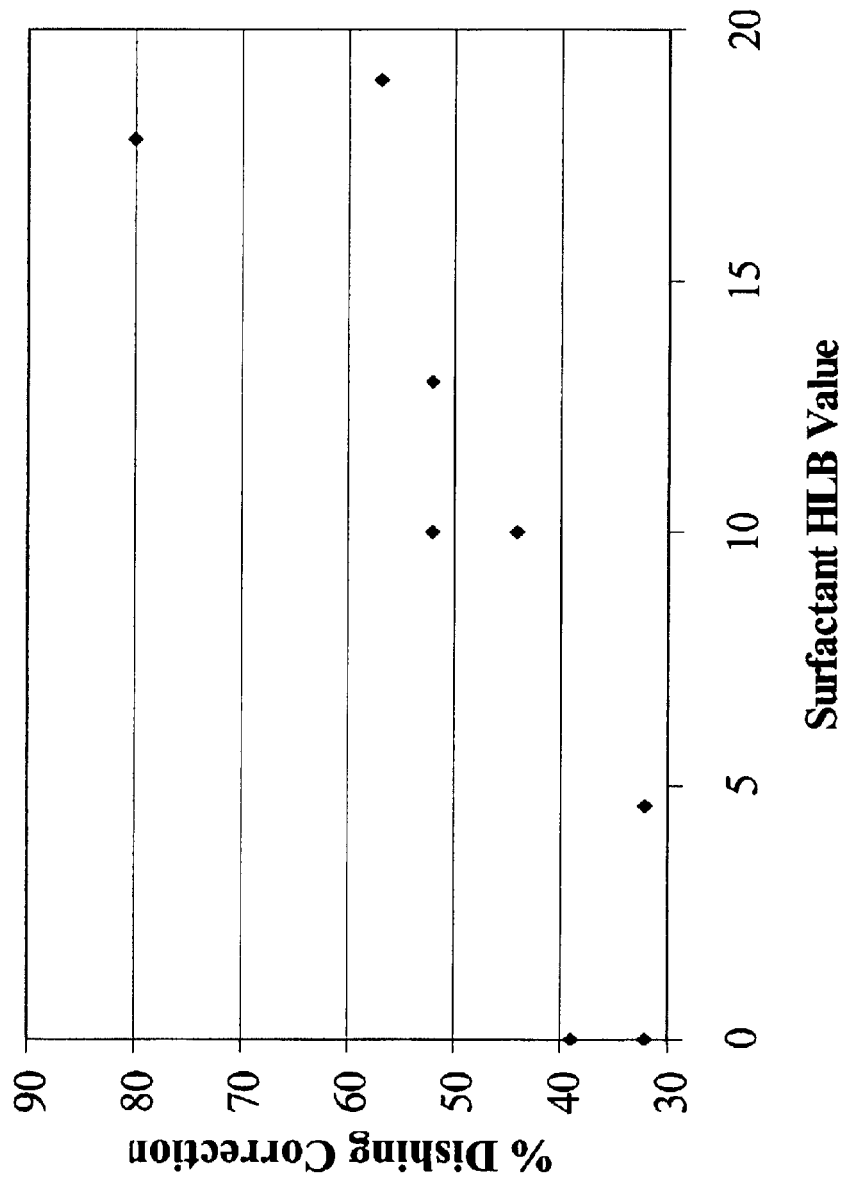
FIG. 2 is a plot showing the relationship between the HLB value of a surfactant in a CMP system and the % copper dishing correction resulting from use of the CMP system on a substrate comprising copper at a 50 $\mu$m line region.

The results in Table 1, as well as FIGS. 1 and 2, demonstrate that the copper dishing and dielectric erosion values are substantially reduced by the presence of an amphiphilic nonionic surfactant, and the copper dishing and dielectric erosion values generally improve with increasing amphiphilic nonionic surfactant HLB value. In particular, polishing compositions comprising amphiphilic nonionic surfactants having an HLB value of greater than 6 (e.g., Polishing Compositions 1B–1E) demonstrate large reductions in copper dishing and dielectric erosion.

EXAMPLE 2

This example illustrates the effect of amphiphilic nonionic surfactants in polishing compositions on copper dishing and erosion values as a function of surfactant concentration.

Similar patterned substrates containing copper, tantalum, and silicon dioxide (Sematech 931 mask wafers) were polished with different polishing compositions (Polishing Compositions 2A–2D). Each of the polishing compositions contained 12 wt. % condensation-precipitated silica, 0.10 wt. % benzotriazole, 0.30 wt. % acetic acid, and 3 wt. % hydrogen peroxide with a pH of about 10 (adjusted with KOH). Polishing Compositions 2A–2D (invention) further contained 0, 100, 125, and 250 ppm of 2,4,7,9-tetramethyl-5-decyne-4,7-diol ethoxylate surfactant, respectively. The percent dishing correction for the 50 μm line region of the patterned substrate was measured for each of the polishing compositions.

Figure 3:
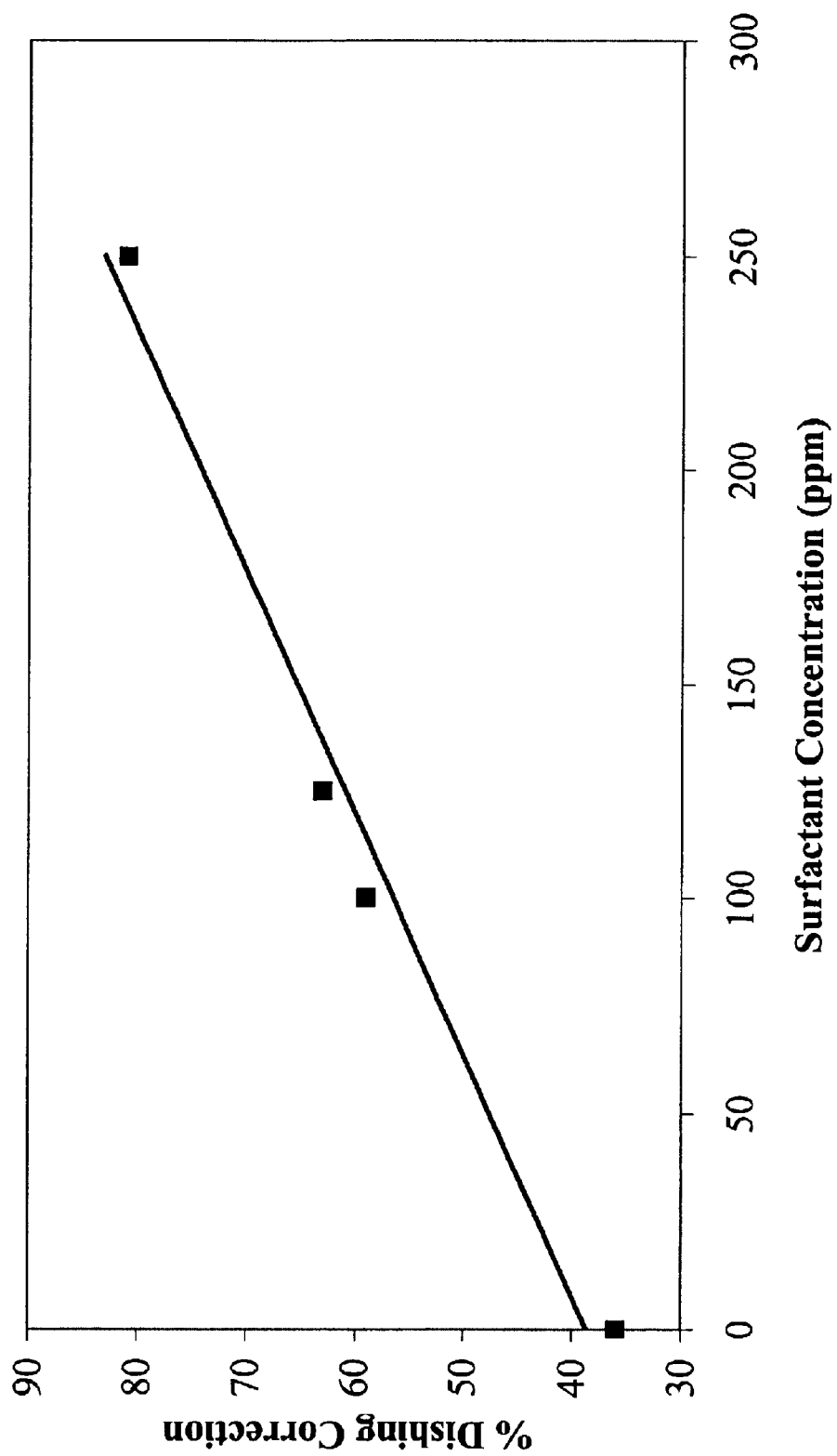
FIG. 3 is a plot showing the relationship between the concentration of a surfactant in a CMP system and the % copper dishing correction resulting from use of the CMP system on a substrate comprising copper at a 50 $\mu$m line region.

A plot of the % copper dishing correction for the 50 μm line as a function of surfactant concentration is shown in FIG. 3.

The results in FIG. 3 demonstrate that the copper dishing is substantially reduced by the presence of an amphiphilic nonionic surfactant having an HLB value of greater than 6 in the polishing compositions, and the dishing values improve with increasing amphiphilic nonionic surfactant concentration.

EXAMPLE 3

This example demonstrates that the presence of amphiphilic nonionic surfactants in the polishing compositions of the invention can be used in first step copper polishing for bulk copper removal.

Similar blanket wafer substrates comprising copper, tantalum, or silicon dioxide were polished with different polishing compositions (Polishing Compositions 3A–3F). Polishing Composition 3A (control) contained 0.7 wt. % lactic acid, 1.11 wt. % polyacrylic acid, 0.111 wt. % benzotriazole, 3 wt. % hydrogen peroxide, and 0.556 wt. % fumed alumina coated with polystyrenesulfonic acid (0.5 wt. % alumina and 0.052 wt. % polystyrenesulfonic acid) at a pH of 4.5 with no amphiphilic nonionic surfactant. Polishing Compositions 3B–3E (invention) were the same as Polishing Composition 3A, except that they further comprised 0.02 wt. %, 0.05 wt. %, 0.075 wt. %, and 0.10 wt. % polyalkyleneoxide-modified polydimethylsiloxane surfactant (HLB ~13–17), respectively. Polishing Composition 3F (invention) was the same as Polishing Composition 3A, except that it further comprised 0.025 wt. % polyalkyleneoxide-modified ethylenediamine (HLB ~7).

The removal rates for the copper, tantalum, and silicon dioxide layers were determined for each of the polishing compositions. The results are summarized in Table 2.

TABLE 2

| Polishing Composition | Surfactant Concentration | Cu RR (Å/min) | Cu:Ta Selectivity | Cu:SiO$_2$ Selectivity |
|---|---|---|---|---|
| 3A (control) | None | 5736 | 169 | 3.8 |
| 3B (invention) | 0.02 wt. % | 3803 | 108 | 6.4 |
| 3C (invention) | 0.05 wt. % | 5082 | 141 | 9.0 |
| 3D (invention) | 0.075 wt. % | 4175 | 119 | 3.4 |
| 3E (invention) | 0.100 wt. % | 3568 | 105 | 5.0 |
| 3F (invention) | 0.025 wt. % | 3804 | 112 | 6.7 |

The results shown in Table 2 demonstrate that the copper removal rates and selectivity of the copper removal to tantalum are not substantially changed upon addition of the amphiphilic nonionic surfactant having an HLB value of greater than 6, but the selectivity of the copper removal to silicon dioxide removal is substantially enhanced.

EXAMPLE 4

This example demonstrates that the presence of amphiphilic nonionic surfactants in the polishing compositions of the invention reduces copper dishing in first step copper polishing.

Similar patterned wafer substrates comprising copper, tantalum, and silicon dioxide layers were polished with different polishing compositions (Polishing Compositions 4A–4C). Polishing Composition 4A (control) contained 0.7 wt. % lactic acid, 1.11 wt. % polyacrylic acid, 0.111 wt. % benzotriazole, 3 wt. % hydrogen peroxide, and 0.556 wt. % fumed alumina coated with polystyrenesulfonic acid (0.5 wt. % alumina and 0.052 wt. % polystyrenesulfonic acid) at a pH of 4.5 with no amphiphilic nonionic surfactant. Polishing Compositions 4B and 4C (invention) were the same as Polishing Composition 4A, except that they further comprised 0.02 wt. % polyalkyleneoxide-modified polydimethylsiloxane surfactant (HLB 13–17) and 0.025 wt. % polyalkyleneoxide-modified ethylenediamine (HLB-7), respectively. The amount of copper dishing (in angstroms) was measured for three different regions of the substrate including the 120 μm line, 100 μm line, and 50 μm line regions. The copper dishing values were determined for each of the polishing compositions and the results are summarized in Table 3.

TABLE 3

| Polishing Composition | Surfactant Concentration | D120 (Å) | D100 (Å) | D50 (Å) |
|---|---|---|---|---|
| 4A (control) | none | 2250 | 2422 | 2090 |
| 4B (invention) | 0.02 wt. % | 1180 | 1568 | 1292 |
| 4C (invention) | 0.025 wt. % | 1260 | 1513 | 1282 |

The results shown in Table 3 demonstrate that the copper dishing is substantially reduced by the presence of amphiphilic nonionic surfactants having an HLB value of greater than 6 in the polishing compositions.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of polishing a substrate comprising:
   (i) contacting a substrate comprising at least one metal layer comprising copper with a chemical-mechanical polishing system comprising:
      (a) an abrasive having a mean primary particle size of about 100 nm or greater,
      (b) an amphiphilic nonionic surfactant comprising a head group and a tail group, and having an HLB value of greater than 6,
      (c) a means for oxidizing the metal layer comprising copper,
      (d) an organic acid,
      (e) a corrosion inhibitor, and
      (f) a liquid carrier; and
   (ii) abrading at least a portion of the metal layer comprising copper to polish the substrate,
   wherein the amphiphilic nonionic surfactant is a block or graft copolymer comprising polyoxyethylene and polydimethylsiloxane, polyoxyethylene and polyoxypropylene, or polyoxyethylene and polyethylene.

2. The method of claim 1, wherein the amiphiphilic nonionic surfactant has an HLB of about 7 or greater.

3. The method of claim 1, wherein the amiphiphilic nonionic surfactant has an HLB of about 6 to about 18.

4. The method of claim 1, wherein the abrasive has a mean particle size of about 105 nm to about 180 nm.

5. The method of claim 1, wherein the abrasive comprises silica or polyelectrolyte-coated alumina.

6. The method of claim 1, wherein the means for oxidizing the metal layer comprising copper comprises a chemical oxidizing agent.

7. The method of claim 1, wherein the organic acid is selected from the group consisting of acetic acid, oxalic acid, tartaric acid, lactic acid, phthalic acid, propionic acid, and combinations thereof.

8. The method of claim 1, wherein the corrosion inhibitor is selected from the group consisting of benzotriazole, 6-tolyltriazole, 1,2,3-triazole, 1,2,4-triazole, and combinations thereof.

9. The method of claim 1, wherein the system has a pH of about 3 or greater.

10. The method of claim 1, wherein the polishing system comprises about 0.005 wt. % or more amphiphilic nonionic surfactant, based on the weight of the liquid carrier and any compounds dissolved or suspended therein.

11. A method of polishing a substrate comprising:
    (i) contacting a substrate comprising at least one metal layer comprising copper with a chemical-mechanical polishing system comprising:
       (a) an abrasive selected from the group consisting of silica, ceria, titania, zirconia, co-formed particles thereof, polymer particles, polymer-coated particles thereof, polymer-coated alumina, and combinations thereof,
       (b) an amphiphilic nonionic surfactant comprising a head group and a tail group, and having an HLB value of greater than 6,
       (c) a means for oxidizing the metal layer comprising copper,
       (d) an organic acid,
       (e) a corrosion inhibitor, and
       (f) a liquid carrier; and
    (ii) abrading at least a portion of the metal layer comprising copper to polish the substrate,
    wherein the amphiphilic nonionic surfactant is a block or graft copolymer comprising polyoxyethylene and polydimethylsiloxane, polyoxyethylene and polyoxypropylene, or polyoxyethylene and polyethylene.

12. The method of claim 11, wherein the amphiphilic nonionic surfactant has an HLB of about 18 or less.

13. The method of claim 11, wherein the abrasive has a mean particle size of about 100 nm or greater.

14. The method of claim 11, wherein the abrasive comprises silica or polymer-coated alumina.

15. The method of claim 11, wherein the means for oxidizing the metal layer comprising copper comprises a chemical oxidizing agent.

16. The method of claim 11, wherein the organic acid is selected from the group consisting of acetic acid, oxalic acid, tartaric acid, lactic acid, phthalic acid, propionic acid, and combinations thereof.

17. The method of claim 11, wherein the corrosion inhibitor is selected from the group consisting of benzotriazole, 6-tolyltriazole, 1,2,3-triazole, 1,2,4-triazole, and combinations thereof.

18. The method of claim 11, wherein the system has a pH of about 3 or greater.

19. The method of claim 11, wherein the polishing system comprises about 0.005 wt. % or more amphiphilic nonionic surfactant, based on the weight of the liquid carrier and any compounds dissolved or suspended therein.

20. A method of polishing a substrate comprising:
    (i) contacting a substrate comprising at least a first metal layer and a second, different metal layer, with a first chemical-mechanical polishing system suitable for removal of the first metal layer and abrading at least a portion of the first metal layer to polish the substrate, wherein the first chemical-mechanical polishing system comprises an abrasive and a liquid carrier, and subsequently, (ii) contacting the substrate with a second chemical-mechanical polishing system suitable for removal of the second metal layer, and abrading at least a portion of the second metal layer to polish the substrate, wherein the second chemical-mechanical polishing system comprises:
  (a) an abrasive,
  (b) an amphiphilic nonionic surfactant comprising a head group and a tail group, and having an HLB value of greater than 6, and
  (c) a liquid carrier, and
wherein the first and second chemical-mechanical polishing systems are different.

21. The method of claim 20, wherein the amphiphilic nonionic surfactant has an HLB of about 6 to about 18.

22. The method of claim 20, wherein the first metal layer comprises copper, tungsten, an alloy thereof, or combination thereof.

23. The method of claim 20, wherein the second metal layer comprises tantalum, titanium, an alloy thereof, or combination thereof.

24. The method of claim 20, wherein the second chemical-mechanical polishing system further comprises a means of oxidizing the second metal layer, an organic acid, or a corrosion inhibitor.

25. The method of claim 20, wherein the tail group comprises a polyoxyethylene having about 4 or more ethylene oxide repeating units, a sorbitan, or a mixture thereof.

26. The method of claim 20, wherein the head group comprises a polysiloxane, a tetra-$C_{1-4}$-alkyldecyne, a saturated or partially unsaturated $C_{6-12}$ alkyl, a polyoxypropylene, a $C_{6-12}$ alkyl phenyl, a $C_{6-30}$ alkyl cyclohexyl, a polyethylene, or mixture thereof.

27. The method of claim 20, wherein the amphiphilic nonionic surfactant is selected from the group consisting of polyoxyethylene alkyl ethers and polyoxyethylene alkyl acid esters, wherein the alkyl is a $C_{6-30}$ alkyl, which can be saturated or partially unsaturated, and is optionally branched.

28. The method of claim 20, wherein the amphiphilic nonionic surfactant is a polyoxyethylene alkylphenyl ether or a polyoxyethylene alkylcyclohexyl ether, wherein the alkyl is a $C_{6-30}$ alkyl, can be saturated or partially unsaturated, and can be optionally branched.

29. The method of claim 20, wherein the amphiphilic nonionic surfactant is a block or graft copolymer comprising polyoxyethylene and polydimethylsiloxane, polyoxyethylene and polyoxypropylene, or polyoxyethylene and polyethylene.

30. The method of claim 20, wherein the abrasive comprises silica or polymer-coated alumina.

* * * * *